US010536166B2

(12) United States Patent
Liu et al.

(10) Patent No.: US 10,536,166 B2
(45) Date of Patent: Jan. 14, 2020

(54) SERIALIZER/DESERIALIZER PHYSICAL LAYER CIRCUIT

(71) Applicant: REALTEK SEMICONDUCTOR CORPORATION, Hsinchu (TW)

(72) Inventors: Jian Liu, Jiangsu Province (CN); Chi-Kung Kuan, San Jose, CA (US)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/437,446

(22) Filed: Jun. 11, 2019

(65) Prior Publication Data
US 2019/0386682 A1 Dec. 19, 2019

(51) Int. Cl.
*H03M 9/00* (2006.01)
*H03L 7/087* (2006.01)
*H03L 7/099* (2006.01)
*H03L 7/089* (2006.01)

(52) U.S. Cl.
CPC .............. *H03M 9/00* (2013.01); *H03L 7/087* (2013.01); *H03L 7/0891* (2013.01); *H03L 7/0992* (2013.01)

(58) Field of Classification Search
CPC ........ H03M 9/00; H03L 7/087; H03L 7/0891; H03L 7/0992
USPC .................................................. 341/100–101
See application file for complete search history.

(56) References Cited

U.S. PATENT DOCUMENTS

| 6,064,706 | A  | * | 5/2000  | Driskill | H03L 7/089 370/516 |
| 6,335,696 | B1 | * | 1/2002  | Aoyagi | H03M 9/00 341/100 |
| 6,414,528 | B1 | * | 7/2002  | Usui | G06F 1/06 327/158 |
| 6,438,188 | B1 | * | 8/2002  | Streett | H03L 7/087 341/100 |
| 7,245,240 | B1 | * | 7/2007  | Nguyen | H03K 5/135 326/46 |
| 7,307,558 | B1 | * | 12/2007 | Karim | H03M 9/00 341/100 |
| 7,342,520 | B1 | * | 3/2008  | Katzman | H03L 7/18 341/100 |
| 7,366,267 | B1 | * | 4/2008  | Lee | H03K 5/135 341/100 |
| 9,973,211 | B1 | * | 5/2018  | Akita | H03L 7/0807 |

(Continued)

*Primary Examiner* — Lam T Mai
(74) *Attorney, Agent, or Firm* — WPAT, PC

(57) ABSTRACT

Disclosed is a Serializer/Deserializer physical layer circuit (SerDes PHY) for receiving and transmitting data in a half-duplex manner, the SerDes PHY including: a clock multiplication unit including a phase frequency detector (PFD), a charge pump (CP), a low pass filter, a voltage-controlled oscillator (VCO) and a loop divider; a sampling circuit sampling a received signal according to clocks from the VCO in a receive mode; a phase detector (PD) operating according to outputs of the sampling circuit; a multiplexer connecting the PD with the CP and disconnecting the PFD from the CP in the receive mode, and connecting the PFD with the CP and disconnecting the PD from the CP in a transmission mode; a parallel-to-serial converter converting parallel data into serial data according a clock from the VCO in the transmission mode; and a transmission driver outputting a transmission signal according to the serial data in the transmission mode.

10 Claims, 8 Drawing Sheets

300

(56) References Cited

U.S. PATENT DOCUMENTS

| | | | |
|---|---|---|---|
| 10,198,368 B2* | 2/2019 | Chen | G06F 13/382 |
| 2005/0147178 A1* | 7/2005 | Kikuchi | H03M 5/20 |
| | | | 375/288 |
| 2006/0109895 A1* | 5/2006 | Watanabe | G01R 31/31922 |
| | | | 375/224 |
| 2006/0202875 A1* | 9/2006 | Fujisawa | G06F 1/025 |
| | | | 341/100 |
| 2008/0107422 A1* | 5/2008 | Cole | H03M 9/00 |
| | | | 398/135 |
| 2009/0028281 A1* | 1/2009 | Chulwoo | G06F 13/385 |
| | | | 375/374 |
| 2009/0041104 A1* | 2/2009 | Bogdan | H03K 5/15013 |
| | | | 375/226 |
| 2009/0128380 A1* | 5/2009 | Hairapetian | H03K 3/356043 |
| | | | 341/100 |
| 2012/0008713 A1* | 1/2012 | Ebuchi | H03K 3/0322 |
| | | | 375/295 |
| 2012/0313799 A1* | 12/2012 | Koyanagi | H03M 9/00 |
| | | | 341/101 |
| 2015/0016579 A1* | 1/2015 | Wu | H04L 7/033 |
| | | | 375/355 |
| 2016/0099717 A1* | 4/2016 | Yoshitani | H03L 7/00 |
| | | | 327/141 |
| 2016/0276991 A1* | 9/2016 | Lin | H03F 1/0205 |

* cited by examiner

SERIALIZER/DESERIALIZER PHYSICAL LAYER CIRCUIT

BACKGROUND OF THE INVENTION

1. Field of the Invention

The present invention relates to a physical layer circuit, especially to a Serializer/Deserializer (SerDes) physical layer circuit.

2. Description of Related Art

A conventional Serializer/Deserializer (SerDes) physical layer circuit includes a receive circuit and a transmit circuit that are independent of each other. The receive circuit and the transmit circuit are configured to carry out serial data receiving and serial data transmission respectively. The receive circuit may be realized with a clock data recovery (CDR) circuit 100 such as the one shown in FIG. 1. The CDR circuit 100 may include a data sampler (DS) 110, an edge sampler (ES) 120, a phase detector (PD) 130, a charge pump (CP) 140, a low pass filter (LPF) 150, and a voltage-controlled oscillator (VCO) 160. The transmit circuit may be realized with a transmit circuit 200 such as the one shown in FIG. 2. The transmit circuit 200 includes a clock multiplication unit (CMU) 210, a parallel-to-serial converter 220, and a transmission driver 230, in which the CMU 210 includes a phase frequency detector (PFD) 212, a charge pump (CP) 214, a low pass filter (LPF) 216, a voltage-controlled oscillator (VCO) 218, and a loop divider (LD) 219. It can be seen from the above that, in order to achieve both functions of signal receiving and transmission, a conventional SerDes physical layer circuit includes duplicate/similar circuits such as two charge pumps, two low pass filters, and two voltage-controlled oscillators, leading to a large circuit area which is unfavorable for circuit miniaturization and cost-effectiveness.

SUMMARY OF THE INVENTION

An object of the present invention is to provide a Serializer/Deserializer (SerDes) physical layer circuit mitigating the problems in the prior art.

The present invention discloses a SerDes physical layer circuit capable of receiving and transmitting data in a half-duplex manner An embodiment of the SerDes physical layer circuit includes a clock multiplication unit (CMU), a sampling circuit, a phase detector, a multiplexer, a parallel-to-serial converter, and a transmission driver. The clock multiplication unit includes a phase frequency detector, a charge pump, a low pass filter, a voltage-controlled oscillator, and a loop divider, in which the voltage-controlled oscillator is configured to output at least one sampling clock (e.g., two clocks having the same frequency but different phases) in a receive mode and configured to output an output clock in a transmission mode. The sampling circuit is coupled to the voltage-controlled oscillator, a data input terminal, and a data output terminal, and the sampling circuit is configured to sample a received signal from the data input terminal according to the at least one sampling clock and thereby output a sampled signal to the data output terminal. The phase detector is configured to carry out phase detection according to the output of the sampling circuit. The multiplexer is configured to electrically couple the phase detector with the charge pump and electrically decouple the phase frequency detector from the charge pump in the receive mode so that the voltage-controlled oscillator outputs the at least one sampling clock to the sampling circuit in the receive mode, and the multiplexer is also configured to electrically couple the phase frequency detector with the charge pump and electrically decouple the phase detector from the charge pump in the transmission mode so that the voltage-controlled oscillator outputs the output clock to the parallel-to-serial converter in the transmission mode. The parallel-to-serial converter is configured to convert parallel data into serial data according the output clock. The transmission driver is configured to output a transmission signal according to the serial data in the transmission mode.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms acknowledged in this industrial field. If any term is defined in the following description, such term should be explained accordingly.

The present disclosure includes a Serializer/Deserializer (SerDes) physical layer circuit (PHY) capable of receiving and transmitting data in a half-duplex manner. The receive circuit and the transmit circuit of the SerDes PHY share some circuits to prevent the waste of circuit area and achieve circuit miniaturization and high cost-effectiveness.

Figure 1:
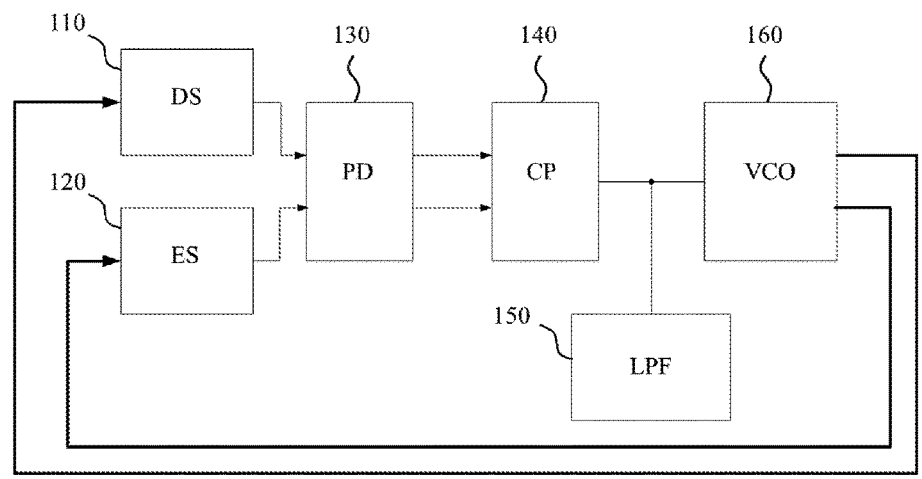
FIG. 1 shows an analog clock data recovery circuit used in a receive circuit of a conventional SerDes physical layer circuit.
Figure 2:
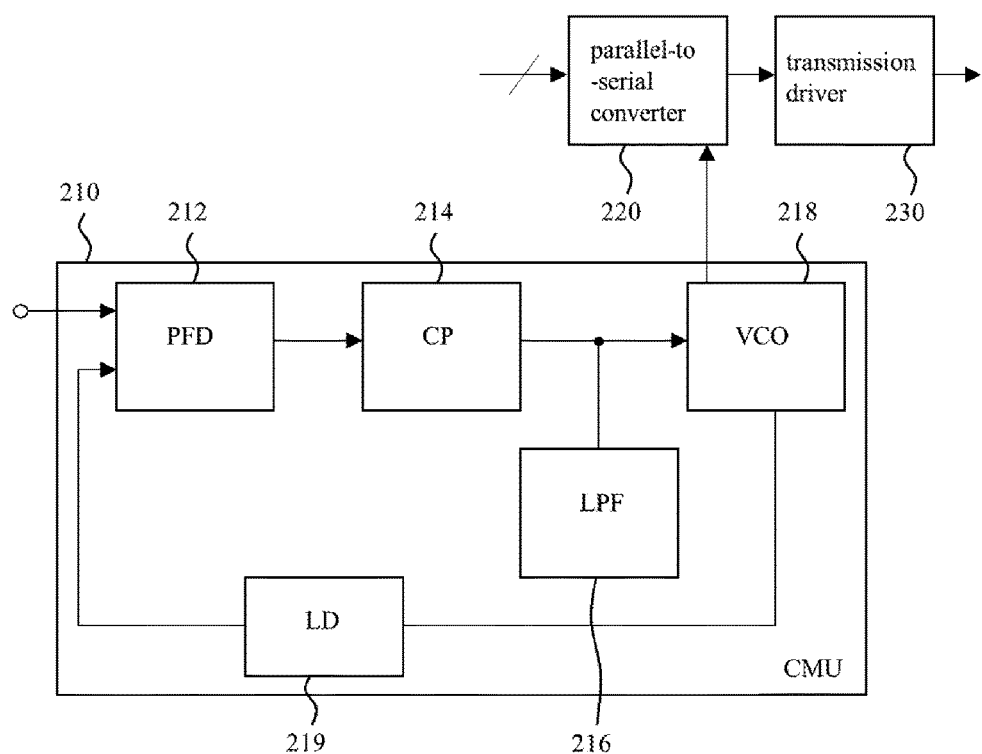
FIG. 2 shows a transmit circuit of a conventional SerDes physical layer circuit.
Figure 3:
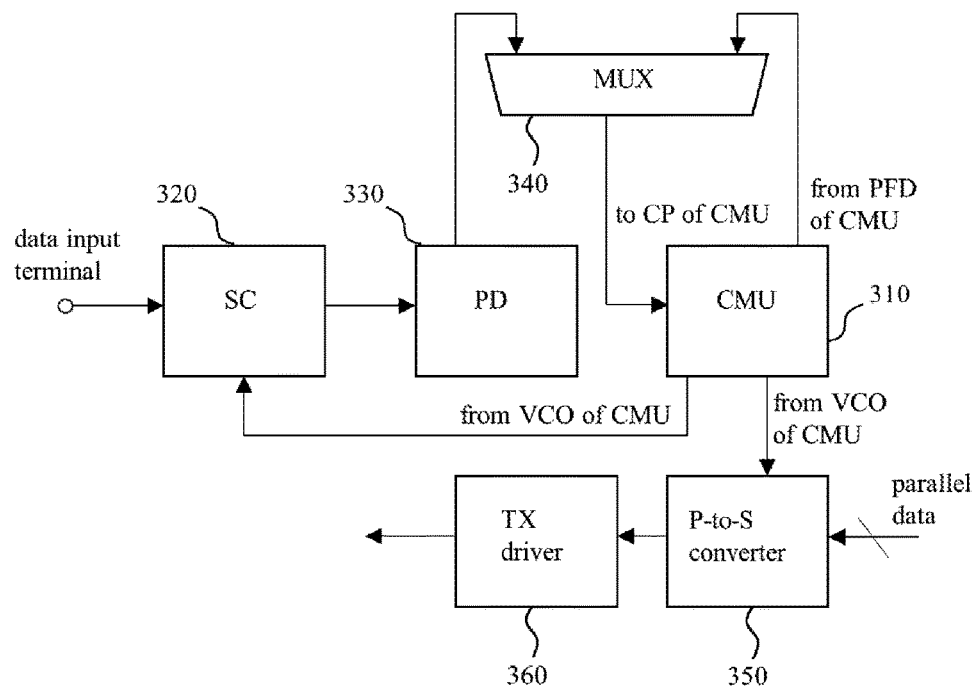
FIG. 3 shows an embodiment of the SerDes physical layer circuit of the present invention.

FIG. 3 shows an embodiment of the SerDes PHY of the present invention applicable to a Universal Serial Bus Type-C(USB Type-C) device or other devices requiring a SerDes PHY. The SerDes PHY 300 of FIG. 3 includes a clock multiplication unit (CMU) 310, a sampling circuit (SC) 320, a phase detector (PD) 330, a multiplexer (MUX) 340, a parallel-to-serial converter (P-to-S converter) 350, and a transmission driver (TX driver) 360.

Figure 4:
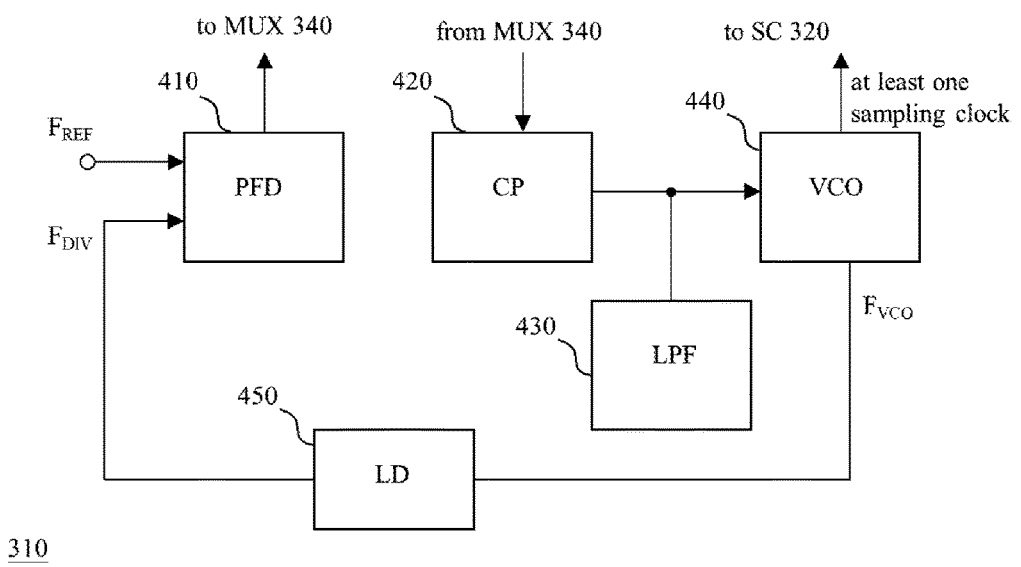
FIG. 4 shows an embodiment of the clock multiplication unit (CMU) of FIG. 3.

FIG. 4 shows an embodiment of the CMU 310 of FIG. 3. The CMU 310 of FIG. 4 includes a phase frequency detector (PFD) 410, a charge pump (CP) 420, a low pass filter (LPF) 430, a voltage-controlled oscillator (VCO) 440, and a loop divider (LD) 450. The phase frequency detector 410 is configured to output a phase frequency detection signal to the multiplexer 340 according to the difference between a reference clock $F_{REF}$ and a frequency-divided clock $F_{DIV}$. The charge pump 420 is configured to generate a voltage control signal according to a multiplexer output signal (i.e., the phase frequency detection signal of the phase frequency detector 410 or a phase detection signal of the phase detector 330) from the multiplexer 340. The low pass filter 430 is configured to determine an input voltage according to the voltage control signal. The voltage-controlled oscillator 440 is configured to generate at least one sampling clock (e.g., two clocks CKI and CKQ, in which the frequencies of CKI and CKQ are the same and the phase difference between CM and CKQ is 90 degree; or a single clock for the sampling circuit 320 to generate the two clocks CM and CKQ) according to the input voltage in a receive mode, and the voltage-controlled oscillator 440 is also configured to generate an output clock $F_{VCO}$ according to the input voltage in a transmission mode. The loop divider 450 is configured to carry out a frequency-division process according to the output clock $F_{VCO}$ and thereby generate the frequency-divided clock $F_{DIV}$; in an exemplary implementation, the frequency of the frequency-divided clock $F_{DIV}$ is substantially equal to or lower than the frequency of the output clock $F_{VCO}$. Each of the phase frequency detector 410, the charge pump 420, the low pass filter 430, the voltage-controlled oscillator 440, and the loop divider 450 can be a known or self-developed circuit. It should be noted that in comparison with a conventional CMU, the phase frequency detector 410 of the CMU 310 is not directly connected to the charge pump 420 but conditionally connected to the charge pump 420 through the multiplexer 340.

Figure 5:
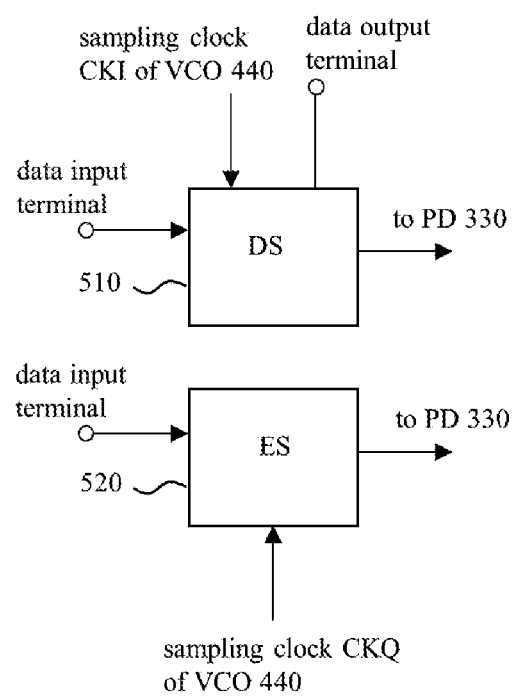
FIG. 5 shows an embodiment of the sampling circuit (SC) of FIG. 3.

FIG. 5 shows an embodiment of the sampling circuit 320 of FIG. 3 including a data sampler (DS) 510 and an edge sampler (ES) 520. The data sampler 510 and the edge sampler 520 are coupled to the voltage-controlled oscillator 440 and a data input terminal, and configured to sample a received signal from the data input terminal according to two sampling clocks (e.g., the aforementioned clocks CM and CKQ) of the voltage-controlled oscillator 440 respectively. The data sampler 510 is further coupled to a data output terminal, and configured to output a sampled signal to the data output terminal according to the result of sampling the received signal. Each of the data sampler 510 and the edge sampler 520 is a known or self-developed circuit.

Please refer to FIG. 3 and FIG. 5. The phase detector 330 is configured to carry out phase detection according to the output of the sampling circuit 320 and thereby output the aforementioned phase detection signal to the multiplexer 340; for instance, the phase detector 330 carries out a known or self-defined logical operation according to the output of the data sampler 510 and the output of the edge sampler 520 and thereby outputs the phase detection signal to the multiplexer 340. The phase detector 340 is a known or self-developed circuit.

Please refer to FIG. 3 and FIG. 4. In the receive mode, the multiplexer 340 electrically connects the phase detector 330 and the charge pump 420 and electrically disconnects the phase frequency detector 410 from the charge pump 420 so that the charge pump 420 generates the voltage control signal according to the phase detection signal of the phase detector 330, then the low pass filter 430 generates the input voltage according to the voltage control signal, and the voltage-controlled oscillator 440 outputs the at least one sampling clock according to the input voltage. In the transmission mode, the multiplexer 340 electrically connects the phase frequency detector 410 and the charge pump 420 and electrically disconnects the phase detector 330 and the charge pump 420 so that the charge pump 420 generates the voltage control signal according to the phase frequency detection signal of the phase frequency detector 410, then the low pass filter 430 generates the input voltage according to the voltage control signal, and the voltage-controlled oscillator 440 generates the output clock $F_{VCO}$ according to the input voltage. The multiplexer 340 is a known or self-developed circuit. It should be noted that the multiplexer 340 operates in one of the receive mode and the transmission mode in accordance with a control signal; since the way to generate a control signal for controlling a multiplexer is well-known, the detail of the control signal is omitted here.

Please refer to FIG. 3 and FIG. 4. The parallel-to-serial converter 350 is configured to convert parallel data into serial data according to the output clock $F_{VCO}$ of the voltage-controlled oscillator 440 in the transmission mode, in which the frequency of a clock for triggering the transmission of the parallel data is not higher than the frequency of a clock for triggering the transmission of the serial data; in addition, the parallel-to-serial converter 350 is a known or self-developed circuit. The transmission driver 360 is configured to output a transmission signal according to the serial data in the transmission mode. In an exemplary implementation, when the SerDes PHY 300 operates in the receive mode, at least one of the phase frequency detector 410, the parallel-to-serial converter 350, and the transmission driver 360 is disabled in accordance with the aforementioned control signal to reduce power consumption; when the SerDes PHY 300 operates in the transmission mode, at least one of the sampling circuit 320 and the phase detector 330 is disabled in accordance with the control signal to reduce power consumption.

Figure 6:
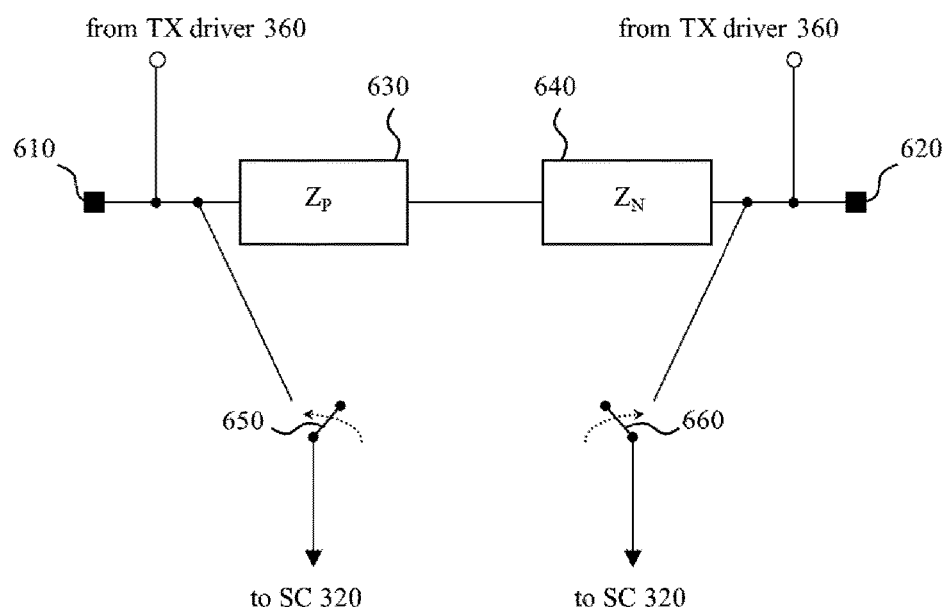
FIG. 6 shows an embodiment of the I/O circuit of the SerDes physical layer circuit of the present invention.

The sampling circuit 320 of FIG. 3 may receive the aforementioned received signal with a known input circuit and the transmission driver 360 of FIG. 3 may transmit the aforementioned transmission signal with a known output circuit, in which the input circuit and the output circuit have the same or similar circuits for operation. In order to reduce the circuit area and the amount of pins of an input and an output circuits for some application such as a USB Type-C application, the SerDes PHY 300 of FIG. 3 may further include an input/output (I/O) circuit coupled to the sampling circuit 320 and the transmission driver 360 to allow the sampling circuit 320 and the transmission driver 360 to share the I/O circuit for the execution of reception and transmission respectively. FIG. 6 shows an embodiment of the above-mentioned I/O circuit. The I/O circuit 600 of FIG. 6 includes a positive-end I/O pad 610, a negative-end I/O pad 620, a positive-end terminal impedance ($Z_P$) 630, a negative-end terminal impedance ($Z_N$) 640, a positive-end switch 650 (e.g., a transistor), and a negative-end witch 660 (e.g., a transistor). The positive-end terminal impedance 630 is coupled between the positive-end I/O pad 610 and the negative-end terminal impedance 640. The negative-end terminal impedance 640 is coupled between the positive-end terminal impedance 630 and the negative-end I/O pad 620. The positive-end switch 650 includes a first terminal and a second terminal, in which the first terminal is coupled to the positive-end I/O pad 610 and the positive-end terminal impedance 630 and the second terminal is coupled to the sampling circuit 320. The negative-end switch 660 includes a third terminal and a fourth terminal, in which the third terminal is coupled to the negative-end I/O pad 620 and the negative-end terminal impedance 640 and the fourth terminal is coupled to the sampling circuit 320. The positive-end switch 650 and the negative-end switch 660 are turned on in the receive mode to allow the sampling circuit 320 to receive the received signal; meanwhile, the transmission driver 360 is disabled. The positive-end switch 650 and the negative-end switch 660 are turned off in the transmission mode; meanwhile, the transmission driver 360 is enabled to transmit the transmission signal.

Figure 7:
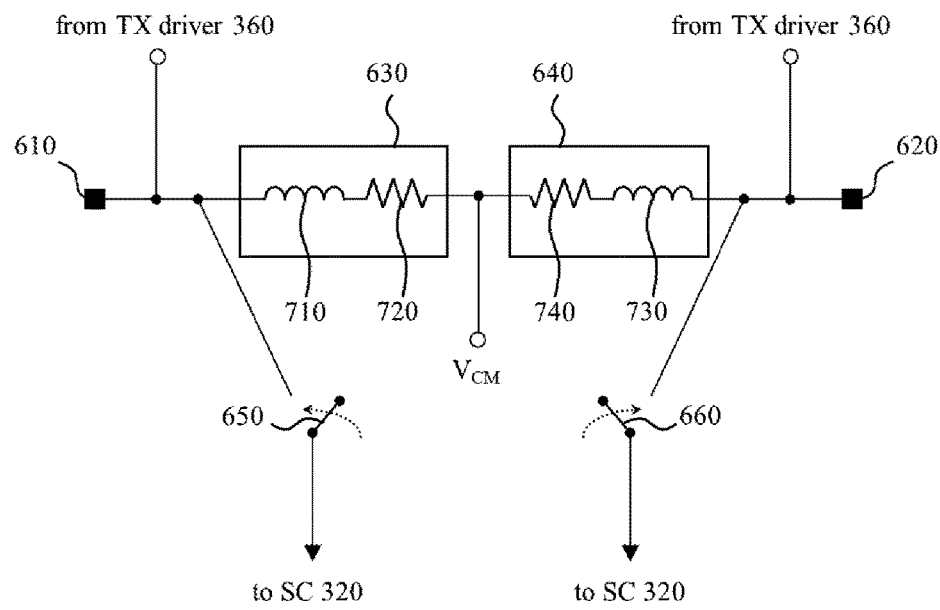
FIG. 7 shows an embodiment of the positive-end terminal impedance and the negative-end terminal impedance of FIG. 6.

FIG. 7 shows an embodiment of the positive-end terminal impedance 630 and the negative-end terminal impedance 640. As shown in FIG. 7, the positive-end terminal impedance 630 includes a positive-end inductor 710 and a positive-end resistor 720, and the negative-end terminal impedance 640 includes a negative-end inductor 730 and a negative-end resistor 740. The impedance value of the positive-end terminal impedance 630 is equal to or different from the impedance value of the negative-end terminal impedance 640. When the two impedance values are substantially the same, the voltage between the positive-end terminal impedance 630 and the negative-end terminal impedance 640 is a common-mode voltage $V_{CM}$. In addition, the introduction of the positive-end inductor 710 and the negative-end inductor 730 is good for increasing the bandwidth related to the aforementioned received signal and the bandwidth related to the aforementioned transmission signal.

Figure 8:
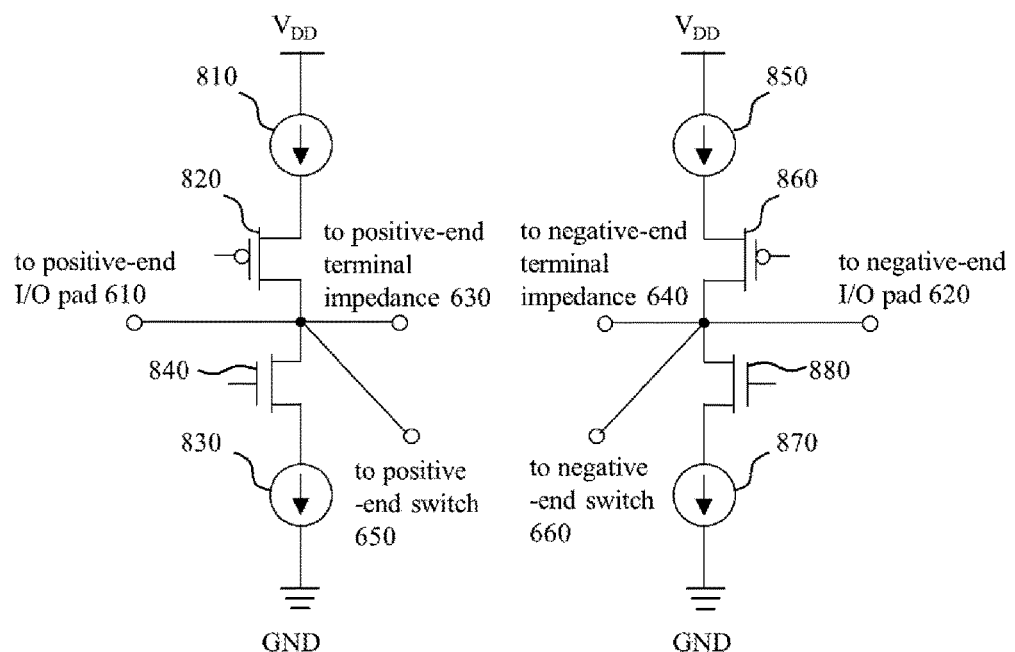
FIG. 8 shows an embodiment of the transmission driver coupled to the I/O circuit of FIG. 6.

FIG. 8 shows an embodiment of the transmission driver 360 coupled to the I/O circuit 600 of FIG. 6. Please refer to FIG. 6 and FIG. 8, the transmission driver 360 includes: a first positive-end current source 810 coupled to a terminal of a high voltage $V_{DD}$; a first positive-end transistor 820 coupled to the first positive-end current source 810 and the positive-end I/O pad 610; a second positive-end current source 830 coupled to a terminal of a low voltage GND; a second positive-end transistor 840 coupled to the second positive-end current source 830 and the positive-end I/O pad 610; a first negative-end current source 850 coupled to a terminal of the high voltage $V_{DD}$; a first negative-end transistor 860 coupled to the first negative-end current source 850 and the negative-end I/O pad 620; a second negative-end current source 870 coupled to a terminal of the low voltage GND; and a second negative-end transistor 880 coupled to the second negative-end current source 870 and the negative-end I/O pad 620. Each of the above-mentioned transistors is turned off in the receive mode to disable the transmission driver 360, and each of the transistors is turned on or off according to the serial data in the transmission mode to enable the transmission driver 360. In an exemplary implementation, the first positive-end current source 810, the second positive-end current source 830, the first negative-end current source 850, and the second negative-end current source 870 are turned off in the receive mode and turned on in the transmission mode for energy conservation.

It should be noted that people of ordinary skill in the art can implement the present invention by selectively using some or all of the features of one embodiment in this specification or selectively using some or all of the features of multiple embodiments in this specification as long as such implementation is practicable, which implies that the present invention can be carried out flexibly.

To sum up, the receive circuit and the transmit circuit of the SerDes PHY of the present invention share several circuits for integration so as to prevent the waste of circuit area and achieve circuit miniaturization and high cost-effectiveness.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A circuit, comprising:
   a clock multiplication unit (CMU) including a phase frequency detector, a charge pump, a low pass filter, a voltage-controlled oscillator, and a loop divider, in which the voltage-controlled oscillator is configured to output at least one sampling clock in a receive mode and configured to output an output clock in a transmission mode;
   a sampling circuit, coupled to the voltage-controlled oscillator and a data input terminal, configured to sample a received signal from the data input terminal according to the at least one sampling clock;
   a phase detector coupled to the sampling circuit;
   a multiplexer configured to electrically couple the phase detector with the charge pump and electrically decouple the phase frequency detector from the charge pump in the receive mode so that the voltage-controlled oscillator outputs the at least one sampling clock to the sampling circuit in the receive mode, and the multiplexer configured to electrically couple the phase frequency detector with the charge pump and electrically decouple the phase detector from the charge pump in the transmission mode so that the voltage-controlled oscillator outputs the output clock to a parallel-to-serial converter in the transmission mode;
   the parallel-to-serial converter configured to convert parallel data into serial data according the output clock; and
   a transmission driver configured to output a transmission signal according to the serial data in the transmission mode.

2. The SerDes physical layer circuit of claim 1, wherein in the receive mode at least one of the phase frequency detector, the parallel-to-serial converter, and the transmission driver is disabled.

3. The SerDes physical layer circuit of claim 2, wherein in the transmission mode at least one of the sampling circuit and the phase detector is disabled.

4. The SerDes physical layer circuit of claim 1, wherein in the transmission mode at least one of the sampling circuit and the phase detector is disabled.

5. The SerDes physical layer circuit of claim 1, further comprising an input/output (I/O) circuit including:
   a positive-end I/O pad;
   a negative-end I/O pad;
   a positive-end terminal impedance coupled between the positive-end I/O pad and a negative-end terminal impedance;
   the negative-end terminal impedance coupled between the positive-end terminal impedance and the negative-end I/O pad;
   a positive-end switch including a first terminal and a second terminal, in which the first terminal is coupled to the positive-end I/O pad and the positive-end terminal impedance and the second terminal is coupled to the sampling circuit; and
   a negative-end switch including a third terminal and a fourth terminal, in which the third terminal is coupled to the negative-end I/O pad and the negative-end terminal impedance and the fourth terminal is coupled to the sampling circuit,
   wherein the transmission driver is coupled to the I/O circuit and disabled in the receive mode, and the positive-end switch and the negative-end switch are turned on in the receive mode and turned off in the transmission mode.

6. The SerDes physical layer circuit of claim 5, wherein the positive-end terminal impedance includes a positive-end inductor and a positive-end resistor, and the negative-end terminal impedance includes a negative-end inductor and a negative-end resistor.

7. The SerDes physical layer circuit of claim 6, wherein an impedance value of the positive-end terminal impedance is equal to an impedance value of the negative-end terminal impedance.

8. The SerDes physical layer circuit of claim 5, wherein the transmission driver includes:
   a first positive-end current source;
   a first positive-end transistor coupled between the first positive-end current source and the positive-end I/O pad, the first positive-end transistor configured to be turned off in the receive mode and turned on or off according to the serial data in the transmission mode;
   a second positive-end current source;
   a second positive-end transistor coupled between the second positive-end current source and the positive-end I/O pad, the second positive-end transistor configured to be turned off in the receive mode and turned on or off according to the serial data in the transmission mode;
   a first negative-end current source;
   a first negative-end transistor coupled between the first negative-end current source and the negative-end I/O pad, the first negative-end transistor configured to be turned off in the receive mode and turned on or off according to the serial data in the transmission mode;
   a second negative-end current source; and
   a second negative-end transistor coupled between the second negative-end current source and the negative-end I/O pad, the second negative-end transistor configured to be turned off in the receive mode and turned on or off according to the serial data in the transmission mode.

9. The SerDes physical layer circuit of claim 8, wherein the first positive-end current source, the second positive-end current source, the first negative-end current source, and the second negative-end current source are disabled in the receive mode and enabled in the transmission mode.

10. The SerDes physical layer circuit of claim 1, which is applicable to a Universal Serial Bus Type-C(USB Type-C) device.

* * * * *